United States Patent [19]
Thompson et al.

[11] Patent Number: 5,976,939
[45] Date of Patent: Nov. 2, 1999

[54] LOW DAMAGE DOPING TECHNIQUE FOR SELF-ALIGNED SOURCE AND DRAIN REGIONS

[75] Inventors: Scott Thompson, Portland; Mark T. Bohr, Aloha; Paul A. Packan, Beaverton, all of Oreg.

[73] Assignee: Intel Corporation, Santa Clara, Calif.

[21] Appl. No.: 08/498,028

[22] Filed: Jul. 3, 1995

[51] Int. Cl.[6] .................................................. H01L 21/336
[52] U.S. Cl. ..................... 438/305; 438/559; 438/563; 438/231
[58] Field of Search .................................. 437/44, 405 W, 437/415 W, 164, 160, 161, 978; 148/DIG. 43; 438/305, 306, 307, 299, 301, 559, 563, 558, 562, 231, 230

[56] References Cited

U.S. PATENT DOCUMENTS

| | | | |
|---|---|---|---|
| 4,079,504 | 3/1978 | Kosa | 437/978 |
| 4,204,894 | 5/1980 | Komeda et al. | 437/164 |
| 5,173,440 | 12/1992 | Tsunashima et al. | 437/164 |
| 5,234,850 | 8/1993 | Liao | 437/415 W |
| 5,518,945 | 5/1996 | Bracchitta et al. | 437/164 |

FOREIGN PATENT DOCUMENTS

| | | | |
|---|---|---|---|
| 61-279129 | 12/1986 | Japan | 437/164 |
| 63-169047 | 7/1988 | Japan | 437/978 |
| 1-207932 | 8/1989 | Japan | 437/978 |

*Primary Examiner*—Michael Trinh
*Attorney, Agent, or Firm*—Blakely, Sokoloff, Taylor & Zafman

[57] ABSTRACT

A process for fabricating a source and drain region which includes a more lightly doped source and drain tip region immediately adjacent to the gate and a more heavily doped main portion of the source and drain region spaced apart from the gate. A first layer of glass (2% BSG) is used to provide the source of doping for the tip region and a second layer of glass (6% BSG) is used to provide the dopant for the more heavily doped major portion of source and drain regions. Spacers are formed between the glass layers to define the tip region from the main portion of the source and drain regions.

4 Claims, 4 Drawing Sheets

LOW DAMAGE DOPING TECHNIQUE FOR SELF-ALIGNED SOURCE AND DRAIN REGIONS

BACKGROUND OF THE INVENTION

1. Field of the Invention

The invention relates to the field of forming self-aligned source and drain regions for field-effect transistors.

2. Prior Art

Typically during the formation of a field-effect transistor, ion implantation is used to align a source and drain region with a gate (and/or with gate spacers in some processes). The ion implantation damages the crystalline structure of the silicon substrate necessitating thermal annealing. During the annealing the implanted dopant diffuses thereby deepening the source and drain regions. These deeper regions make it difficult to control the adverse effects of short channels. Ideally, to control the short channel effects where effective channel lengths are in the order of 0.1 um or less, the source and drain regions should be extremely shallow and heavily doped (e.g., 0.05 to 0.1 um versus 0.2 to 0.4 um for ion implanted regions).

Scaling implanted p+ junctions is particularly difficult since the light boron ($B^{11}$) ions channel during implantation and secondly, since the ions damage the silicon bonds causing point defects. These point defects significantly increase the diffusion of the boron atoms (up to 1000 times) during subsequent thermal annealing. Thus, even for light ions, such as B11, and low energy implants, the implant damage results in enhanced diffusion.

One solution to this problem is to make amorphous the silicon substrate before the B11 implant since this reduces channeling. However, the net result is not a significantly shallow profile since the damage to the silicon lattice leads to enhance diffusion of the implanted B11.

Another technique for solving this problem is to diffuse the portion of the source and drain regions adjacent to the gate (tip or tip region) from doped spacers and to form the more heavily doped main portions of the source and drain regions by ion implantation. This provides some advantage over the ion implantation of both the tip region and main portion of the source and drain regions but implant damage from the source/drain implant still affects the depth of the diffused tip region resulting in degraded short channel effects. Short channel effects are discussed in numerous publications such as *Silicon Processing for the VLSI Era*, Vol. 2, by S. Wolf, published by Lattice press, see Section 5.5, beginning at page 338.

As will be seen, the present invention permits the simultaneous doping of an ultra shallow lightly doped source and drain tip regions, main portions of the source and drain regions and doping of the polysilicon gate without ion implantation.

SUMMARY OF THE INVENTION

A method is described for fabricating field-effect transistors on a substrate where the source and drain regions are formed in alignment with a gate. A source of dopant is used having (i) a more lightly doped region which is formed directly adjacent to the gate and (ii) a more heavily doped region spaced apart from the gate. This dopant source is formed on the surface of the substrate. The dopant is diffused from the source of dopant in a heating step simultaneously forming both the lightly doped source and drain tip region and the main portion of the source and drain regions.

In one embodiment boron is diffused from two different layers of borosilicate glass (BSG). Spacers are formed adjacent to the gate by anisotropically etching a silicon nitride layer which overlies a 2% BSG layer. Then a 6% BSG layer is formed over the spacers and 2% BSG layer to supply the dopant for the more heavily doped main portion of the source and drain regions. Rapid thermal processing is used to diffuse the dopant into the substrate from both BSG layers.

DETAILED DESCRIPTION OF THE INVENTION

Figure 1:
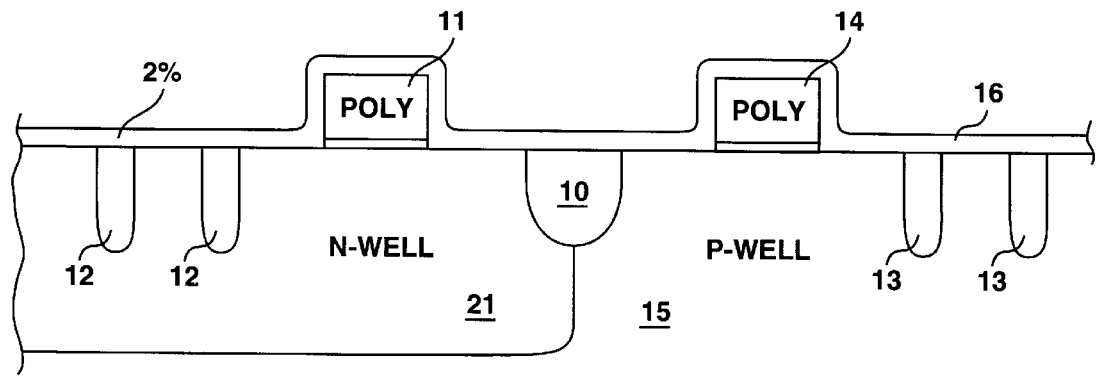
FIG. 1 is a cross sectional elevation view of a section of a substrate showing an n-well isolated from a p-well. Polysilicon gates and a first glass layer are also shown.

A method and structure for forming low damage, shallow source and drain regions in alignment with a gate for a field-effect transistor is described. In the following description, numerous well-known steps such as masking and etching steps are not discussed in detail in order not to obscure the present invention. In other instances, specific details are set forth such as specific boron dopant concentrations in order to provide a thorough understanding of the present invention.

The various layers of materials shown in the drawings are not shown to scale. Rather, the layers have been made clearly visible so that the present invention can be better understood from the drawings. Additionally, only a portion of a substrate showing a single p-channel and n-channel transistor is illustrated. It will be appreciated that in practice the invention is used to fabricate an entire integrated circuit.

While the present invention is not limited to any particular geometry in one embodiment, it is used for the fabrication of transistors having a channel length of approximately 0.1 um with transistors that operate from a 1.8 volt supply.

Referring now to FIG. 1, a section of a monocrystalline silicon substrate 15 is illustrated having a well doped within an n-type conductivity dopant (n well 21) and a region or well doped with a p-type conductivity dopant (p well). As will be seen, it is not important to the present invention whether both n and p wells are used. For instance, an n well may be used for p-channel transistors with the n-channel transistors being formed directly in a p-type substrate.

The n and p well of FIG. 1 are isolated from one another by a recessed isolation region specifically, trench 10. Additionally, within the n well 21 there are other isolation trenches 12 for isolating from one another p-channel transistors formed within the n well. Likewise, there are isolation trenches 13 formed within the p well to isolate n-channel transistors formed in the p well from one another. The isolation trenches may be formed using well-known technology. Other isolation technologies such as local oxidation of silicon (LOCOS) may be used instead of trenches A gate insulative layer (such as a high quality, thermally grown oxide to insulate the gate from the substrate) is formed over the substrate. Following this, a polycrystalline silicon (polysilicon) layer is deposited and the gates for the field-effect transistors are fabricated using ordinary photolithographic and etching techniques. Two such gates insulated from the substrate are shown in FIG. 1. Gate 11, formed above the n well, as will be seen, is used for a p-channel transistor; the other gate 14, formed above the p well, is used for an n-channel transistor, Numerous steps typically used before the fabrication of the gates are not illustrated, such as cleaning steps, ion implantation steps to adjust threshold voltage, etc.

Following the formation of the gates 11 and 14 a conformal layer 16 of borosilicate glass (BSG) is deposited over the entire substrate. This layer may be 100 Å–300 Å thick. The layer in one embodiment has a 2% functional description concentration of a p-type conductivity dopant (boron). This layer is referred to hereinafter as 2% BSG layer. TEOS or silane based chemistry is used to deposit the 2% BSG layer. This layer is formed in one embodiment at a temperature of 400–600° C.

In the embodiment of the present invention described in this application, the p-channel transistor is formed using the present invention while the n-channel transistor is formed using well-known ion implantation. The formation of the n-channel transistor is described nonetheless since the masking steps for the n-type implants are used to diffuse the p-type dopant sources.

Figure 2:
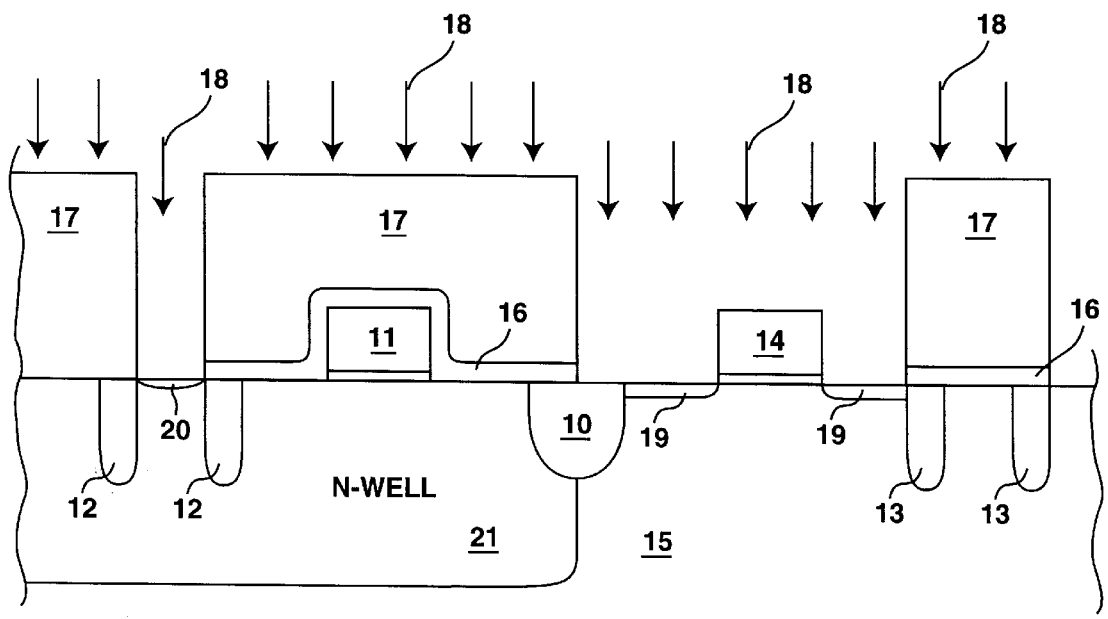
FIG. 2 illustrates the substrate of FIG. 1 after a first photoresist layer has been masked and etching, and during an ion implantation step used to form the tip regions for the n-channel transistor.

FIG. 2 illustrates the first of two ion implantation step used in the formation of the n-channel transistor. First, a photoresist layer 17 is formed over the substrate 15. This layer is masked exposed and developed by well-known techniques to reveal the substrate regions where the source and drains are formed for the n-channel transistors and additionally, regions where an n-type dopant is used for well tap 20. This is shown in FIG. 2 where the photoresist members 17 protect predetermined areas of the substrate while leaving exposed other areas. Next, the exposed portions of glass layer 16 are etched in alignment with the photoresist members 17. This etching step uses a hydrogen fluoride (HF) based solution. The substrate is then subjected to ion implantation of an arsenic dopant as shown by the arrows 18. This forms the regions 19 in alignment with the gate 14 and a region 20 between the trenches 12. This arsenic doping implant is relatively light and is used for forming the tip regions of the source and drain regions for the n-channel transistor. The main portions of the source and drain regions for this n-channel transistor are subsequently formed with the second ion implantation step.

Figure 3:
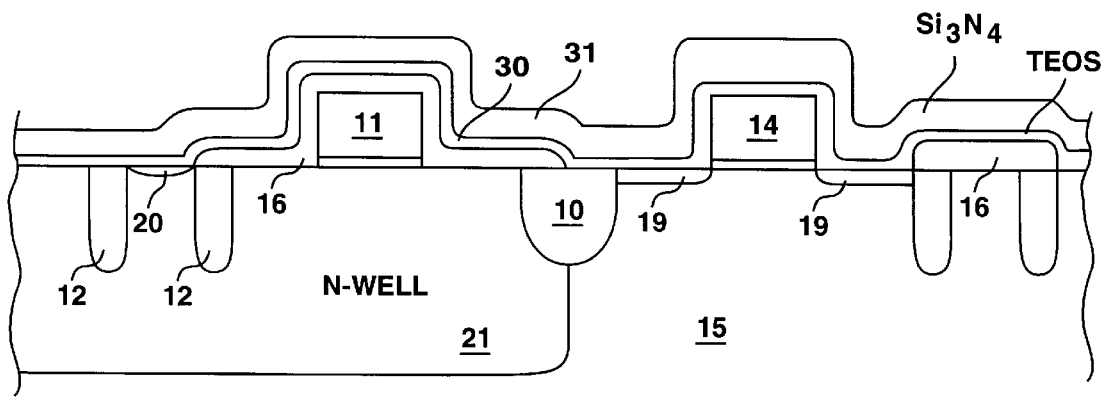
FIG. 3 illustrates the substrate of FIG. 2 after the formation of a TEOS layer and a silicon nitride layer.

Next, as shown in FIG. 3, a conformal layer of undoped silicon dioxide is formed from tetraethyl orthosilicate (TEOS) by low pressure chemical vapor deposition layer 30 or other undoped LPCVD oxide film is formed over the substrate using well-known processing. This layer provides an etchant stop for the spacers formed for the n-channel transistor. The TEOS layer may be 50 Å–300 Å thick.

Figure 4:
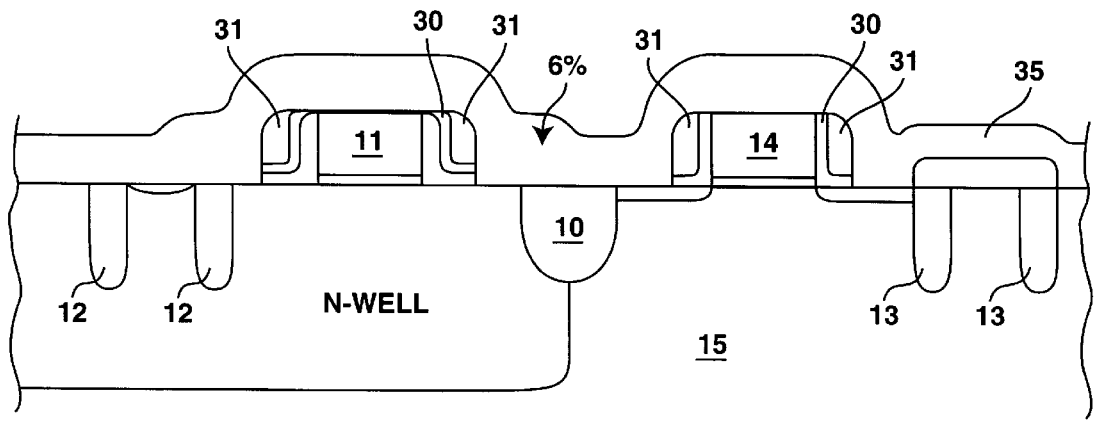
FIG. 4 illustrates the substrate of FIG. 3 after the silicon nitride layer has been anisotropically etched to form spacers and after the substrate has been covered with a second glass layer.

Now, as shown in FIG. 3 a conformal layer 31 of silicon nitride is formed over the TEOS layer 30. (An oxide layer may be used instead of the silicon nitride layer.) This silicon nitride layer is approximately 800 Å thick in one embodiment. Well-known anisotropic etching is used to etch the silicon nitride layer to form spacers 31 shown on opposite sides of gates 11 and 14 of FIG. 4. The TEOS layer acts as an etchant step to protect the silicon. The TEOS and BSG regions not covered by the nitride spacers are also etched away. A wet etchant may be used for this purpose.

Following this, a second layer 35 of BSG is formed over the substrate. This time, however, the layer has a 6% concentration of boron (6% BSG). This layer in one embodiment is approximately 200 Å–600 Å thick and is deposited using a TEOS or silane based chemistries at a temperature of 400–600° C. in one embodiment.

Better results may be achieved for some processes if a relatively thin cap layer (e.g., 100 Å) of undoped glass or silicon nitride (not shown) is formed over the 6% BSG layer. This undoped layer protects the 6% BSG from a subsequent photoresist layer formed over the glass and assures that dopant will not diffuse upward. This layer also prevents water from the photoresist layer from reacting with the boron dopant.

Figure 5:
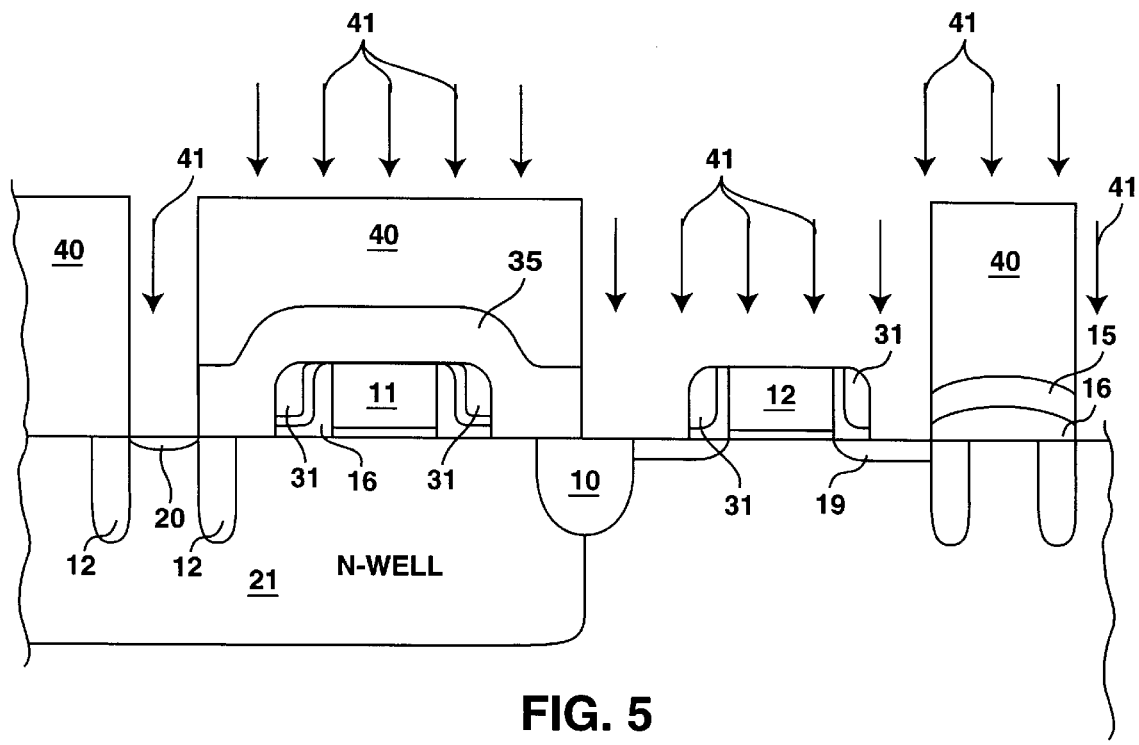
FIG. 5 illustrates the substrate of FIG. 4 after the masking and etching of a photoresist layer and during an ion implantation step used to form the main portion of the source and drain regions for the n-channel transistor.

As shown in FIG. 5, following the formation of the 6% BSG layer 35, a photoresist layer 40 is masked, exposed and developed to expose generally the same areas that were exposed in FIG. 2. Specifically, gate 12, the areas adjacent to gate 12 (source and drain regions) and region 20; the remainder of the substrate shown in FIG. 5 is protected by the photoresist members 40.

The cap layer over the glass layer 35 (if used) and the 6% BSG layer 35 are then etched in alignment with the photoresist members 40. This is done by HF based chemistry.

The second n-type ion implantation step is now used to implant the arsenic dopant into the regions of the substrate not protected by the photoresist layer 40, spacers 31, or gate 12. The arrows 41 illustrate the implantation of this arsenic dopant. This dopant is used to form the main portions N+ of the 45 source and drain regions for the n-channel transistors. Note that since the spacers 31 are in place, the dopant is implanted in alignment with the spacers and not in alignment with the gate.

Following this, a driving (heating) step, is used. The p-type dopant from the 2% BSG and 6% BSG layers is simultaneously diffused into the substrate to form both the tip regions, main source and drain regions, and doping of the gate 11 for the p-channel transistor. The tip region has a depth of 300–700 Å which the main portion of the p-type region has depth of 1000–2500 Å. Additionally, the p-type dopant from the BSG layers forms a well tap between the isolation trenches 13. In one embodiment, this drive step employs rapid thermal processing. Specifically, driving at 1000° C. to 1040° C. for 10–20 seconds with ramping up to and down from this temperature at 70° C. per second. A standard Halogen lamp based rapid thermal reactor is used.

Figure 6:
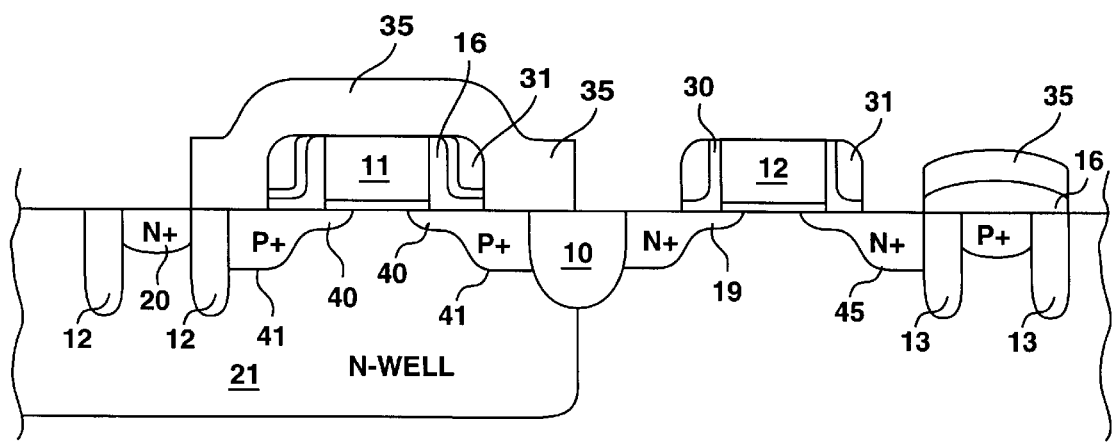
FIG. 6 illustrates the substrate of FIG. 5 after diffusion of the boron dopant from the glass layers to form the source and drain regions for the p-channel transistor.

Well-known processing may be used to complete the fabrication of the integrated circuit shown in FIG. 6. The glass layers 16 and 35 to the extent remaining as shown in FIG. 6 may remain in place for the remainder of the processing and may stay in the completed integrated circuit. Glass layer 35 may be removed to facilitate a subsequent selective TiSi or $CoSi_2$ layer on gates 11 and 12 and regions 41 and 45.

The result of the processing described above is a source and drain region for the p-type transistor having a tip region 40 adjacent to the gate (from the dopant diffused into the substrate from the 2% BSG layer 16) and a more highly doped main portion of the source and drain regions 41 spaced apart from the gate (from the dopant diffused from the 6% BSG layer 35). For the described embodiment the p-type tip region has a dopant concentration of $1-5 \times 10^{19}$ cm$^{-3}$ while the main portion of the source and drain region has a dopant concentration of $2-5 \times 10^{20}$ cm$^{-3}$. This results directly from the 2% and 6% BSG. Other concentrations of dopants in the glass may be used. For example, layer 16 may have a dopant concentration between 1 to 4% and layer 35 may have a dopant concentration between 6 to 12%.

The ultra-shallow p$^+$ regions formed with the described invention, as illustrated in the figures has shown to provide substantial improvement over prior art fabrication where the p-channel source and drain regions are formed with a tip implant in alignment with the gate followed by implantation of the main portion of source and drain regions in alignment with a spacer. Transistors made with the low damage doped source and drain regions of the present invention have shown in one benchmark to have a 25% improved gate delay when operated at 1.8v even when compared to a prior art transistor operated at 2.5v.

With the present invention as described above, two masking steps are saved when compared to the prior art technique of forming the p-channel device through two implantation steps, one for the tip implant and the other for the main portion of the source and drain regions. Note that with the present invention, the two masking steps used to expose those areas of the substrate which are doped with the n-type dopant for the n-channel transistor source and drain region are also used to etch the BSG layers 16 and 35. In the prior art, two additional masking steps are needed to protect the n-channel device when the p-channel device are implanted.

As shown in FIG. 5, the glass layer 35 is etched in alignment with the photoresist members 40 prior to the implantation illustrated by lines 41. It may be desirable in some processes to leave the 6% BSG layer in place. The second ion implantation step used to form the N+ source and drain regions for the n-channel transistor is then done through this glass layer. The counter doping effect of the boron dopant in the n-type source and drain regions in general will not present a problem. The arsenic dopant level of the source and drain region for the n-channel transistor is high and consequently, not significantly affected by the introduction of the boron atoms. Leaving layer 35 in place saves the step used to remove this layer from the areas not protected by the photoresist members.

While in the above description, the p-channel transistor is shown fabricated with the present invention and the n-channel transistor is fabricated using conventional ion implantation, the n-channel transistor may likewise be fabricated using one or two layers of glass phosphorous or arsenic doped glass.

While in the above-described process the dopant for the p-channel transistor was obtained from a glass, specifically BSG, other materials may be used as a source of the dopant such as polysilicon or germanium-silicon.

Figure 7:
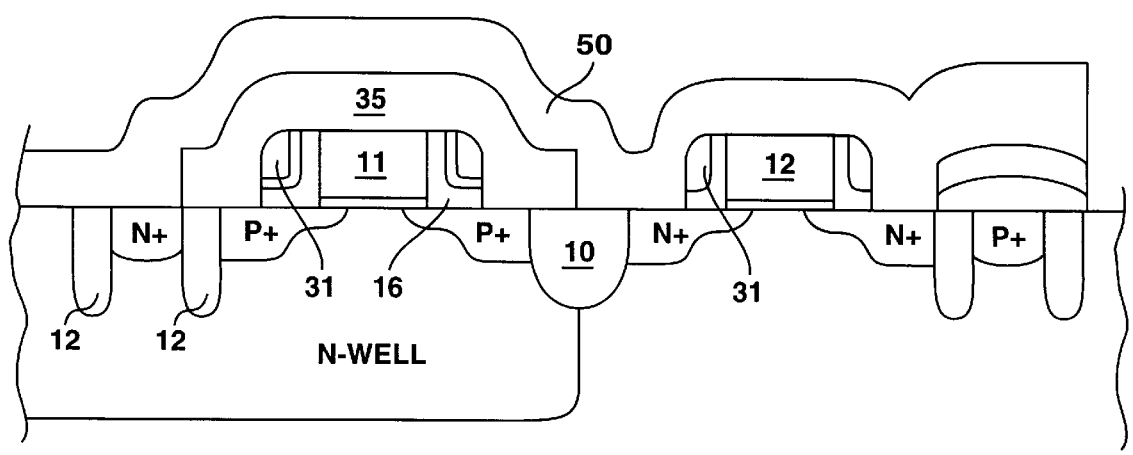
FIG. 7 illustrates the substrate of FIG. 4 for an alternate embodiment where the n-type dopant is diffused from a glass layer.

FIG. 7 illustrates alternate processing where a single glass layer doped with an n-type dopant is used to form the source/drain for the n-channel transistor. For this processing, following the etching of the glass layer 35, an additional glass layer 50 doped with the n-type dopant (e.g., 6% PSG) is formed as shown in FIG. 7. (The glass layer 50 is formed over the structure shown in FIG. 5 without the photoresist layer 40). During the driving step used to dope the source/drain and gate of the p-channel transistor the n-channel transistor is simultaneously formed. Dopant from layer 50 forms the main source/drain regions of the n-channel transistor. Note the dopant from layer 50 does not diffuse into the layer 35. This n-type dopant also diffused under the spacers of gate 12 to form more lightly doped tip regions for the n-channel transistor. At the same time, the gate 12 is doped with the n-type dopant from layer 50.

With similar processing note that the glass layer 16 need not be used to form the p-channel transistor. That is, as in the case for the n-channel transistor described in conjunction with FIG. 7, the p-type dopant may be driving under the spacer of gate 11 from the 6% glass layer to form the tip source/drain regions for the p-channel transistor. This permits the doping of source/drain for both n-channel and p-channel transistors with a single masking step.

Thus, an improved process and structure for providing doping for a source and drain region has been described which employs two layers with different doping concentrations to permit simultaneously doping of a lightly doped tip regions and more heavily doped main portions of source and drain regions. Ultra shallow source and drain regions are obtained with improved short channel properties.

We claim:

1. A method for forming a field-effect transistor on a substrate region doped with a first conductivity type dopant comprising the steps of:

forming a gate insulated from the substrate;

forming a glass layer containing a second conductivity type dopant over the substrate including over the gate;

forming a silicon dioxide layer over the first glass layer;

forming a silicon nitride layer over the layer of silicon dioxide;

forming spacers on opposite sides of the gate from the silicon nitride layer, silicon dioxide layer and glass layer.

2. The method defined by claim 1 including forming the silicon dioxide layer from tetraethyl orthosilicate.

3. The method defined by claim 1 wherein the glass layer is borosilicate.

4. In the fabrication of a field-effect transistor where spacers are formed in part from a doped glass and an overlying silicon nitride layer and where dopant from the glass doped is diffused into the substrate to form extension source and drain regions, an improvement wherein a layer of silicon dioxide is formed from tetraethyl orthosilicate between the doped glass layer and the silicon nitride layer.

* * * * *